(12) United States Patent
Nakayama

(10) Patent No.: US 8,087,956 B2
(45) Date of Patent: Jan. 3, 2012

(54) CONDUCTIVE CONTACT HOLDER AND CONDUCTIVE CONTACT UNIT

(75) Inventor: Hiroshi Nakayama, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 387 days.

(21) Appl. No.: 11/919,507

(22) PCT Filed: Apr. 27, 2006

(86) PCT No.: PCT/JP2006/308905
§ 371 (c)(1),
(2), (4) Date: Oct. 30, 2009

(87) PCT Pub. No.: WO2006/118220
PCT Pub. Date: Nov. 9, 2006

(65) Prior Publication Data
US 2010/0041251 A1    Feb. 18, 2010

(30) Foreign Application Priority Data
Apr. 28, 2005  (JP) .................................. 2005-133165

(51) Int. Cl.
*H01R 13/24* (2006.01)
(52) U.S. Cl. ...................................................... 439/700
(58) Field of Classification Search .................. 439/700
See application file for complete search history.

(56) References Cited

U.S. PATENT DOCUMENTS 6,507,207 B2    1/2003  Nguyen
6,937,045 B2 *  8/2005  Sinclair .................... 324/755.05

FOREIGN PATENT DOCUMENTS

| CN | 1537233 | 10/2004 |
|---|---|---|
| EP | 1 471 357 A2 | 10/2004 |
| EP | 1 496 366 A1 | 1/2005 |
| EP | 1 496 367 A1 | 1/2005 |
| GB | 1 255 465 | 12/1971 |
| JP | 06-216205 | 8/1994 |
| JP | HEI 7-218536 | 8/1995 |
| JP | 08-136578 A | 5/1996 |
| JP | HEI 10-332764 | 12/1998 |
| JP | 2000-046867 A | 2/2000 |
| JP | 2001-099889 | 4/2001 |
| JP | 2001-273964 | 5/2001 |

(Continued)

OTHER PUBLICATIONS

Notice of Allowance dated Feb. 3, 2010, issued in Korean Patent Application No. 10-2007-7024592.

(Continued)

*Primary Examiner* — Truc Nguyen
(74) *Attorney, Agent, or Firm* — Edwards Wildman Palmer LLP

(57) ABSTRACT

A conductive contact holder includes a holder substrate that is made of a conductive material. The holder substrate has a first opening section for holding conductive signal contacts, and a holding member that is made of an insulating material and that is arranged into the first opening section for holding at least one of the conductive signal contacts. The largest outer diameter of a surface of the holding member parallel to a surface of the conductive contact holder is larger than the smallest interval between longitudinal axes of the conductive contacts held in the conductive contact holder.

11 Claims, 14 Drawing Sheets

FOREIGN PATENT DOCUMENTS

| | | |
|---|---|---|
| JP | 2002-124552 | 4/2002 |
| JP | 2004-530870 | 10/2004 |
| TW | 436633 B | 5/2001 |
| TW | 567317 B | 12/2003 |
| WO | WO-02/073220 | 9/2002 |
| WO | WO-03/005044 | 1/2003 |
| WO | WO-03/067268 | 8/2003 |

OTHER PUBLICATIONS

International Search Report for International Application No. PCT/JP2006/308905, mailed Aug. 15, 2006.

Bing et al., Guo, "Propagation of Ulstrashort Electrical Pulses On Coplanar Striplines," China Academic Journal Electronic Publishing House, vol. 29, No. 4, Apr. 2000, pp. 312-216.

Chinese Office Action dated Aug. 21, 2009 issued in Chinese Patent Application No. 200680012073.6.

Notice of Allowance with Search Report from Taiwanese patent application No. 095115194 dated Nov. 21, 2007.

Japanese Office Action for Japanese Patent Application No. 2005-133165 dated Mar. 1, 2011.

Supplementary Partial European Search Report for European Patent Application No. EP 06 74 5788.7 issued Feb. 3, 2011.

* cited by examiner

CONDUCTIVE CONTACT HOLDER AND CONDUCTIVE CONTACT UNIT

TECHNICAL FIELD

The present invention relates to a conductive contact holder that houses a plurality of conductive contacts that are used for performing a burn-in test on a prescribed circuit structure such as a semiconductor integrated circuit and also relates to a conductive contact unit that includes the conductive contact holder with the conductive contacts.

BACKGROUND ART

In related art, as a technology for performing a burn-in test on a prescribed circuit structure such as a semiconductor integrated circuit, a technology related to a conductive contact unit in which a plurality of conductive contacts (contact probes) corresponding to an electrode for external connection included in the circuit structure (for example, refer to Patent document 1) are arranged thereon is known. Such a conductive contact unit includes a plurality of conductive contacts, a conductive contact holder that houses the conductive contacts at certain positions, and an inspection circuit that is electrically connected to the conductive contacts.

In recent years, semiconductor integrated circuits are being downsized and their operating speeds are being increased. In view of this, there is a requirement for conductive contact units that they are small and able to operate at a high-speed. Particularly, to realize a conductive contact unit for a circuit structure that is driven at high frequency, an impedance matching to match the characteristic impedance of the conductive contact, which forms a part of a transmission path, to the characteristic impedance of the circuit structure needs to be performed with good accuracy.

[Patent Document 1] Japanese Patent Laid-Open Application No. 2002-124552

DISCLOSURE OF INVENTION

Problem to be Solved by the Invention

To realize the conductive contact unit for a circuit structure that is driven at high frequency, diameters of the conductive contacts, which receive and output electrical signals, need to be made smaller. However, there is a problem of reduction in strength and durability of the conductive contact holder with small-diameter conductive contacts and of the overall conductive contact unit.

The present invention has been made in view of the foregoing discussion and it is an object thereof to provide a conductive contact holder and a conductive contact unit that are applicable to a circuit structure as an inspection subject that transmits high-frequency signals, and are excellent in strength and durability.

Means for Solving Problem

To solve the above mentioned problems, and to achieve the above-mentioned objects, according to an aspect of the present invention, there is provided a conductive contact holder that holds at least conductive signal contacts that input and output a signal to and from a prescribed circuit structure. The conductive contact holder includes a holder substrate made of a conductive material and having a first opening section configured to hold the conductive signal contacts; and a holding member made of an insulating material, configured to be inserted into the first opening section for holding at least one of the conductive signal contacts. Largest diameter of a surface of the holding member that is parallel to a surface of the conductive contact holder is larger than smallest interval between longitudinal axes of the conductive signal contacts when held in the conductive contact holder.

According to another aspect of the present invention, there is provided a conductive contact holder that holds at least conductive signal contacts that input and output a signal to and from a prescribed circuit structure and a conductive ground contact that supplies a ground potential to the circuit structure. The conductive contact holder includes a holder substrate made of a conductive material and having a first opening section configured to hold the conductive signal contacts and a second opening section configured to hold the conductive ground contact while maintaining an electrical connection with the conductive ground contact; and a holding member made of an insulating material, configured to be inserted into the first opening section for holding at least one of the conductive signal contacts. Largest outer diameter of a surface of the holding member that is parallel to a surface of the conductive contact holder is larger than smallest interval between longitudinal axes of the conductive signal contacts when held in the conductive contact holder.

In the above aspects, the holding member is an insulating glass member having two hollow portions for holding a pair of the conductive signal contacts such that the conductive signal contacts are not in electric contact with each other and the longitudinal axes thereof are parallel to each other.

In the above aspects, the holder substrate includes a first substrate having a fourth opening section and a fifth opening section respectively corresponding to the first opening section and the second opening section; and a second substrate having a seventh opening section and an eighth opening section respectively corresponding to the first opening section and the second opening section, and fixed to the first substrate so that the seventh opening section communicates with the fourth opening section and the eighth opening section communicates with the fifth opening section, while the insulating glass member includes a first glass-like member inserted into the fourth opening section; and a second glass-like member having the same shape as the first glass-like member, and inserted into the seventh opening section.

In the above aspects, the first and the second glass-like members are respectively formed with a locking flange to one end, and respectively inserted into the fourth opening section and the seventh opening section so that the locking flange is positioned at a boundary side of the first substrate and the second substrate.

The conductive contact holder according to the above aspect further comprises a conductive pipe member made of a conductive material, configured to be inserted into the second opening section for holding the conductive ground contact.

In the above aspects, the holder substrate further includes a third opening section for holding a conductive power-supply contact that supplies electrical power to the circuit structure, and in the third opening section, an insulating pipe member made of an insulating material and holding the conductive power-supply contact is inserted.

According to still another aspect of the present invention, there is provided a conductive contact unit that includes conductive signal contacts that input and output a signal to and from a prescribed circuit structure; a conductive ground contact that supplies a ground potential to the circuit structure; a conductive contact holder including a holder substrate made of a conductive material and having a first opening section configured to hold the conductive signal contacts and a second opening section configured to hold the conductive ground contact while maintaining an electrical connection with the conductive ground contact; and a holding member made of an insulating material, configured to be inserted into the first opening section for holding at least one of the conductive signal contacts; and a circuit substrate electrically connected at least to the conductive signal contacts and including a circuit that produces a signal to be input to the circuit structure. Largest outer diameter of a surface of the holding member that is parallel to a surface of the conductive contact holder is larger than smallest interval between longitudinal axes of the conductive signal contacts when held in the conductive contact holder.

In the above aspects, the holding member is an insulating glass member having two hollow portions for holding a pair of the conductive signal contacts such that the conductive signal contacts are not in electric contact with each other and the longitudinal axes thereof are parallel to each other.

In the above aspects, the circuit substrate includes a coplanar microstrip line for differential transmission.

Effect of the Invention

According to the present invention, a conductive contact holder and a conductive contact unit including a holder substrate that is made of a conductive material and has a first opening section formed thereon that holds conductive signal contacts that input and output signals to and from a prescribed circuit structure, and a holding member that is made of an insulating material, inserted into the first opening section, and holding at least one of the conductive signal contacts is provided. The conductive contact holder and the conductive contact unit are applicable even when a circuit structure of an inspection subject transmits high-frequency signals and are excellent in strength and durability, by making the largest outer diameter of a surface of the holding member parallel to a surface of the conductive contact holder larger than the smallest interval between longitudinal axes of the conductive signal contacts held in the conductive contact holder.

Figure 1:
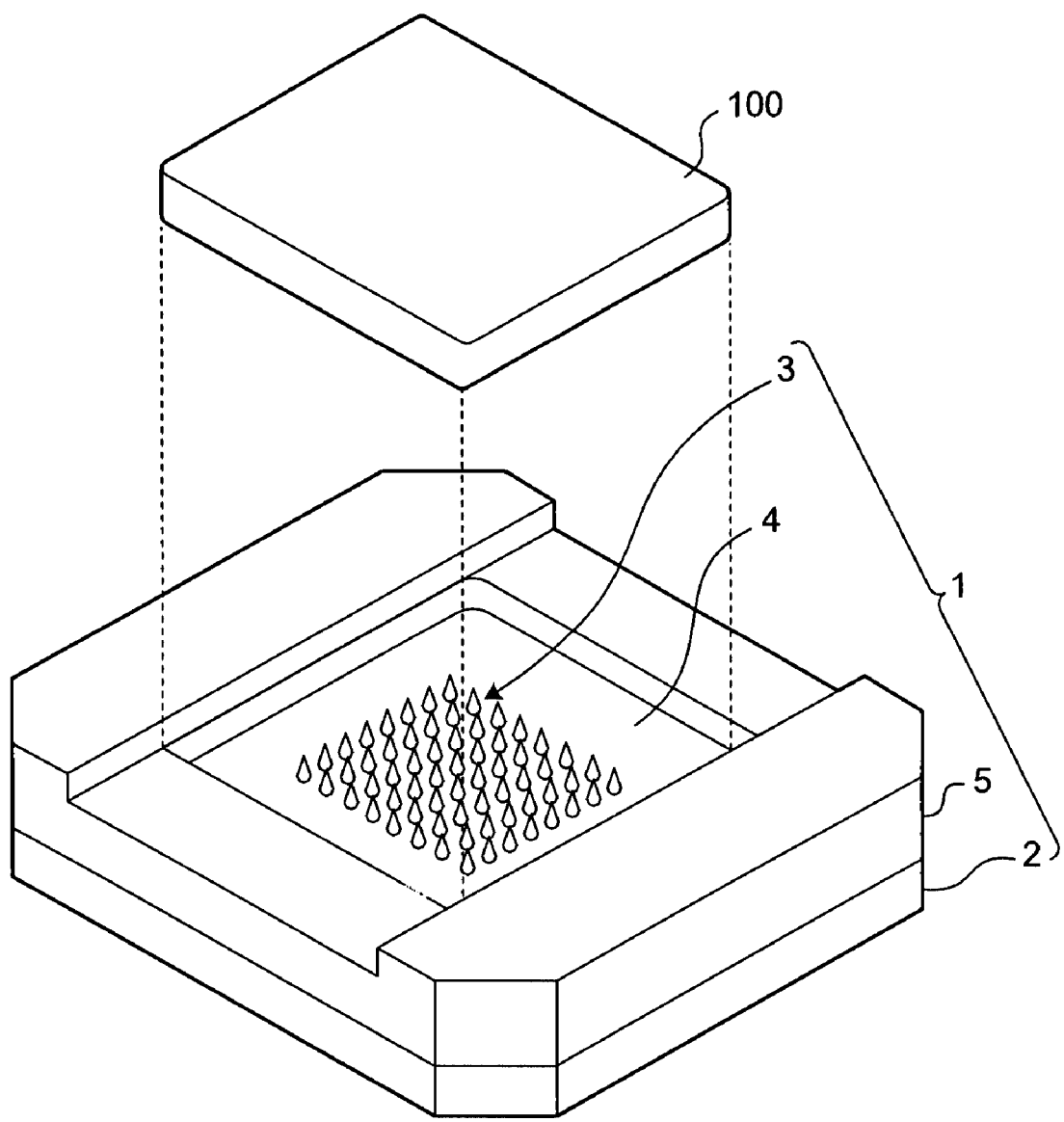
FIG. 1 is a diagram of an overall configuration of a conductive contact unit according to a first embodiment of the present invention.

EXPLANATIONS OF LETTERS OR NUMERALS 1 conductive contact unit
2, 2' circuit substrate
2a, 2b, 2'a signal electrode
2G, 2'G ground electrode
3 conductive contact
4, 41, 42, 43, 44, 45, 46, 47 conductive contact holder
4a, 4b, 44a, 44b insulating member
5 holder member
6, 9, 10, 11 insulating glass member
6a, 6b glass-like member
7 conductive pipe member
7a, 7b, 8a, 8b, 12a, 12b, 16a, 16b pipe-like member
8, 12, 13, 14, 15 insulating pipe member
21, 22, 24, 25, 27, 28, 91, 92, 94, 95 needle-like member
21a, 22a, 24a, 25a, 27a, 28a
23, 26, 29 spring member
31, 34 conductive signal contact
32, 35 conductive ground contact
33 conductive power-supply contact
51, 81 first opening section
52 second opening section
53 third opening section
54, 82 fourth opening section
55 fifth opening section
56 sixth opening section
57, 83 seventh opening section
58 eighth opening section
59 ninth opening section
61, 62, 63, 64, 65, 66, 67, 68 locking flange
71, 74, 77 holder substrate
72, 75, 78 first substrate
73, 76, 79 second substrate
93, 96 pipe body
100 semiconductor integrated circuit
101 connecting electrode

BEST MODE(S) FOR CARRYING OUT THE INVENTION

Best modes (hereinafter, "embodiments") for carrying out the present invention will be described below with reference to the accompanying drawings. The drawings are schematic, and it should be noted that a relationship between the thickness and the width of each portion, and ratios of the thicknesses of respective portions, for example, may be different from those of the actual ones. It is apparent that portions with different relative sizes or ratios may be included between the respective drawings.

First Embodiment

FIG. 1 is a perspective view of a configuration of a conductive contact unit according to a first embodiment of the present invention. A conductive contact unit 1 shown in the diagram receives and outputs electrical signals, supplies electrical power, and supplies a ground potential to a prescribed circuit structure. The conductive contact unit 1 houses a plurality of conductive contacts that electrically connect the circuit structure as an inspection subject and an inspection circuit that is provided corresponding to the circuit structure.

More specifically, the conductive contact unit 1 includes a circuit substrate 2 that, for example, produces electrical signals supplied to a semiconductor integrated circuit 100 as an inspection subject, a plurality of conductive contacts 3 that electrically connect the circuit substrate 2 and the semiconductor integrated circuit 100, a conductive contact holder 4 that holds the conductive contacts 3 at certain positions, and a holder member 5 that is arranged at an outer periphery of the conductive contact holder 4 and prevents movement of the semiconductor integrated circuit 100 during inspection.

The circuit substrate 2 includes an inspection circuit for inspecting the electric characteristics of the semiconductor integrated circuit 100. To the circuit substrate 2, an electrode (not shown in FIG. 1) that electrically connects the above inspection circuit to the conductive contacts 3 is accordingly arranged on a surface that opposes the holder member 5.

Figure 2:
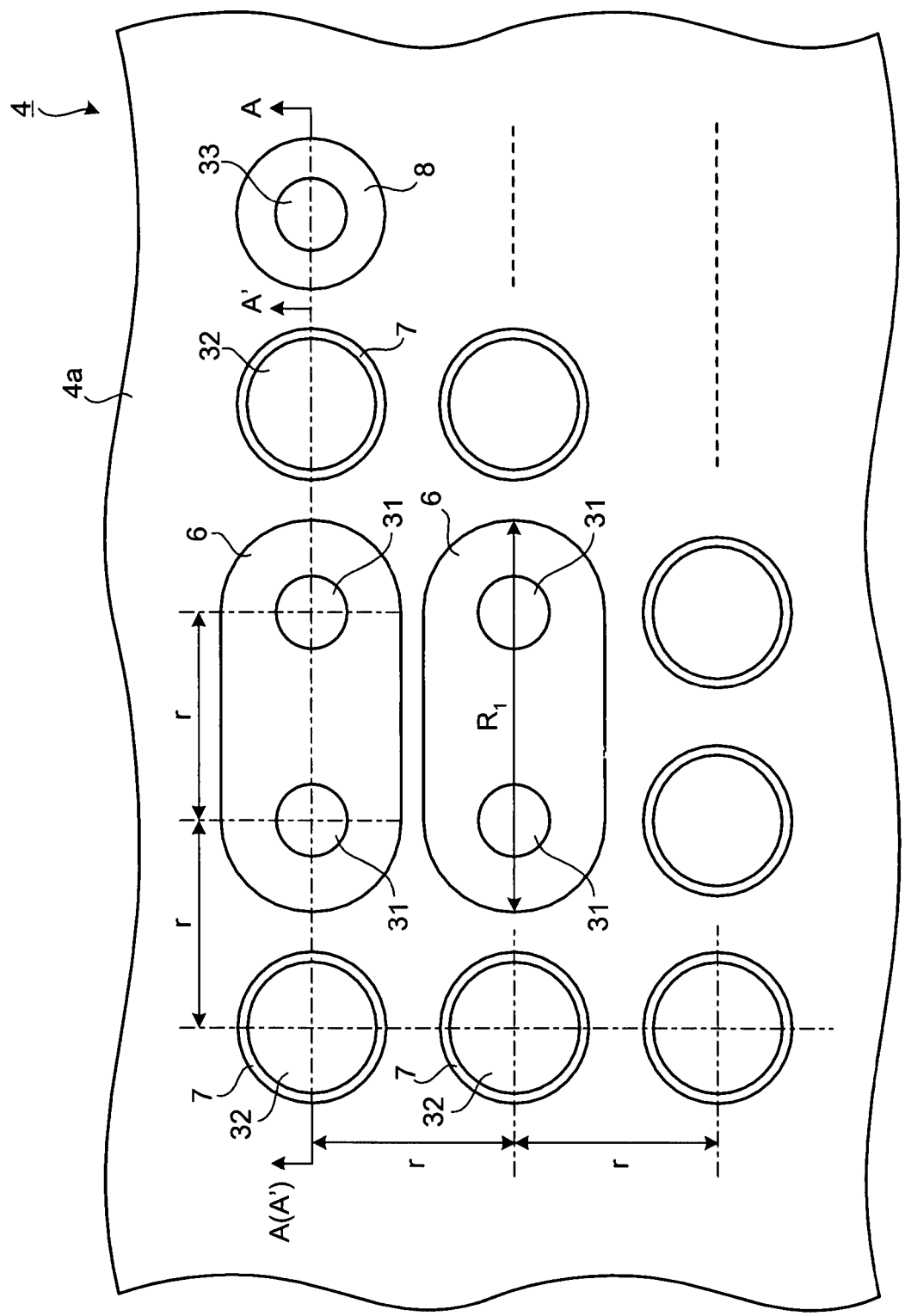
FIG. 2 is a diagram of a configuration of a conductive contact holder and conductive contacts that form the conductive contact unit according to the first embodiment of the present invention.
Figure 3:
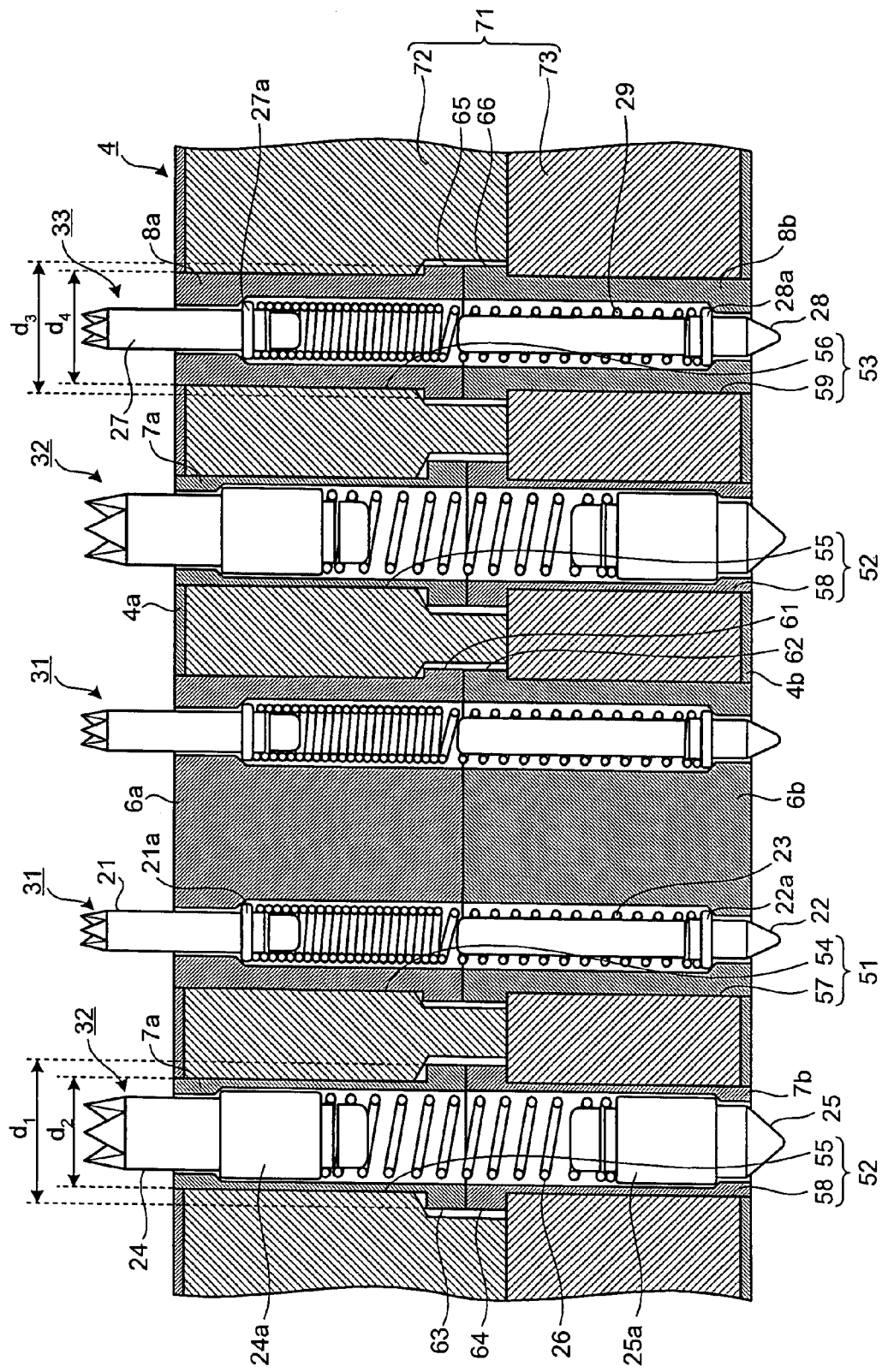
FIG. 3 is a cross-section along a line A-A of FIG. 2.

FIG. 2 is a top view of a partial configuration of the conductive contact holder 4 mounted with the conductive contacts 3 thereon. FIG. 3 is a cross-section along a line A-A of FIG. 2. By using FIGS. 2 and 3, the configuration of the conductive contacts 3 and the conductive contact holder 4 will be explained.

First, the configuration of the conductive contacts 3 will be explained. The conductive contacts 3 are broadly classified into three types, depending on types of signals and the like they supply to the semiconductor integrated circuit 100. Specifically, the conductive contacts 3 are broadly classified into conductive signal contacts 31 that receive and output electrical signals to and from the semiconductor integrated circuit 100, conductive ground contacts 32 that supply ground potential to the semiconductor integrated circuit 100, and conductive power-supply contacts 33 that supply electrical power to the semiconductor integrated circuit 100.

The conductive signal contact 31 includes a needle-like member 21 that is in contact with the electrode of the circuit substrate 2, a needle-like member 22 that is in contact with a connecting electrode of the semiconductor integrated circuit 100 when the semiconductor circuit 100 is mounted thereon, and a spring member 23 that is provided between the needle-like members 21 and 22, and telescopically connects the two needle-like members 21 and 22. The needle-like members 21 and 22, and the spring member 23 are arranged on one axis. Because the spring member 23 expands and contracts along its longitudinal axis, an impact against the connecting electrode of the semiconductor integrated circuit 100 is softened when mounting the semiconductor integrated circuit 100.

One end of the needle-like member 21 is so shaped that a plurality of clips project along its longitudinal axis, enabling to have a firm hold on the connecting electrode provided in the semiconductor integrated circuit 100. Meanwhile, a flange 21a that comes into contact with an end of the spring member 23 is provided to a base portion of the needle-like member 21. The flange 21a has a locking function of the conductive signal contact 31 to the conductive contact holder 4, by contacting with an insulating holding member (insulating glass member 6) that holds the conductive signal contact 31.

The needle-like member 22 has a tapering end that comes into contact with the electrode on the circuit substrate 2. The needle-like member 22 can move along its longitudinal axis by the telescopic movement of the spring member 23, urged in an electrode direction by an elastic force of the spring member 23, and can contact with the electrode of the circuit substrate 2 in a state of reduced contact resistance. The needle-like member 22 has a flange 22a that has the locking function similar to the flange 21a of the needle-like member 21.

The conductive ground contact 32 includes needle-like members 24 and 25, and a spring member 26 that telescopically connects the needle-like members 24 and 25. The needle-like member 24 to the needle-like member 21, the needle-like member 25 to the needle-like member 22, and the spring member 26 to the spring member 23 have similar configurations. That is, the needle-like members 24 and 25 have flanges 24a and 25a. The locking function of the conductive ground contact 32 to the conductive contact holder 4 is enabled, because these flanges contact with a conductive holding member (conductive pipe member 7) that holds the conductive ground contact 32.

As shown in FIG. 3, the outer diameter of the conductive ground contact 32 is larger than the outer diameter of the conductive signal contact 31 and the conductive power-supply contact 33. Because the conductive ground contact 32 does not have to perform an impedance matching with a characteristic impedance, the outer diameter can be enlarged to the maximum in view of required strength, durability, and electrical conductivity.

The conductive power-supply contact 33 may be applied to the conductive contact having the same shape as the conductive signal contact 31. In other words, the conductive power-supply contact 33 includes needle-like members 27 and 28 having the same shape as the needle-like members 21 and 22, respectively. The needle-like members 27 and 28 are connected to each other by a spring member 29 having the same shape as the spring member 23. That is, a flange 27a having the same shape as the flange 21a is provided to the needle-like member 27, and a flange 28a having the same shape as the flange 22a is provided to the needle-like member 28. The locking function of the conductive power-supply contact 33 to the conductive contact holder 4 is enabled, because these flanges 27a and 28a contact with an insulating holding member (insulating pipe member 8) that holds the conductive power-supply contact 33. From the viewpoint of the withstand current, the diameter of the conductive power-supply contact 33 may be made larger than the diameter of the conductive signal contact 31.

In the following description, when the three types of the conductive contacts need not be distinguished, they are collectively referred simply as the "conductive contacts 3", and when individual types of conductive contacts are to be referred, each name will be used.

A configuration of the conductive contact holder 4 according to the first embodiment will now be explained. The conductive contact holder 4 holds the conductive contacts 3 in matrix, corresponding to the configuration of the semiconductor integrated circuit 100. The conductive contact holder 4 includes a holder substrate 71 that is made of conductive material (conductive metal, conductive resin, or the like), and insulating members 4a and 4b that coat a certain portion of a surface of the holder substrate 71.

The conductive contact holder 4 is made by inserting the holding member, which holds the conductive contacts 3, into an opening section provided to the holder substrate 71. Three types of such holding members are provided corresponding to the three types of the conductive contacts 3. Thus, the insulating glass member 6 holds a pair of the conductive signal contacts 31, the conductive pipe member 7 holds the conductive ground contact 32, and the insulating pipe member 8 holds the conductive power-supply contact 33.

The holder substrate 71 that is a base material of the conductive contact holder 4 includes opening sections that respectively holds the insulating glass member 6, the conductive pipe member 7, and the insulating pipe member 8 that are the holding members. More specifically, a first opening section 51 that holds the insulating glass member 6, a second opening section 52 that holds the conductive pipe member 7, and a third opening section 53 that holds the insulating pipe member 8 are formed so as to penetrate through the holder substrate 71 at certain positions. The holder substrate 71 has a capacity to hold approximately hundreds to thousands of conductive contacts 3. Where to form the opening section is determined corresponding to the circuit structure, the shape, and the like of the semiconductor integrated circuit 100, and an arrangement shown in FIG. 2 is only an example.

The holder substrate 71 has a configuration that a first substrate 72 and a second substrate 73 are superimposed with each other. To the first substrate 72, a fourth opening section 54, a fifth opening section 55, and a sixth opening section 56 that respectively form a part of the first opening section 51, the second opening section 52, and the third opening section 53 are provided at certain positions. To the second substrate 73, a seventh opening section 57, an eighth opening section 58, and a ninth opening section 59 that respectively form a part of the first opening section 51, the second opening section 52, and the third opening section 53 are provided at certain positions. The first substrate 72 and the second substrate 73 are fixed in a state that the fourth opening section 54 and the seventh opening section 57, the fifth opening section 55 and the eighth opening section 58, and the sixth opening section 56 and the ninth opening section 59 are in contact with each other so as to coaxially communicate with each other.

The fourth opening section 54 to the ninth opening section 59 are respectively formed at their respective positions by conducting drilling, etching, or clicking, or performing processing using a laser, an electronic beam, an ion beam, a wire electric discharge or the like to the first substrate 72 and the second substrate 73.

Because individual conductive contacts 3 relative to the holder substrate 71 are negligible in size, the electric potential of the holder substrate 71 does not fluctuate much due to the electric charge supplied from the conductive contacts 3. Therefore, even when electric charge is supplied to the conductive ground contact 32 from the semiconductor integrated circuit 100, the electric charge is immediately released and diffused to the holder substrate 71. Accordingly, the electric potentials of the conductive ground contact 32 and the holder substrate 71 are stably maintained at ground potential.

The holder substrate 71 also has a blocking function. That is, the holder substrate 71 blocks an electromagnetic wave that is generated and emitted while electrical signals pass through one conductive signal contact 31, or an electromagnetic wave that propagate to the holder substrate 71 from outside, from reaching other conductive signal contact 31 and the conductive power-supply contact 33.

Accordingly, for the holder substrate 71 to fully exercise the function of maintaining the ground potential and blocking the electromagnetic waves, it is preferable that the volume resistivity of the conductive material from which the holder 71 is made be low. That is, it is preferable to use gunmetal, beryllium copper, or the like. Also, for the holder substrate 71 to maintain the ground potential, it is preferable that the electrical contact resistance between the first substrate 72 and the second substrate 73 be low. Accordingly, it is further desirable to polish a contact surface between the first substrate 72 and the second substrate 73 to a smooth finish, or treat the surface with nickel plating and gold plating, or the like.

The insulating members 4a and 4b that coat the surface of the holder substrate 71 electrically insulate the circuit substrate 2 and the semiconductor integrated circuit 100 with the holder substrate 71. Such insulating members 4a and 4b may be formed into a film, by a coating method such as calendar process, extrusion, immersion, spraying, spreading, and electrodeposition. The insulating members 4a and 4b may be formed by using chemical vapor deposition (CVD), or by using an oxide film such as alumite.

Configurations of each type of the holding members will now be explained in detail. The insulating glass member 6 has two substantially cylindrical hollow portions that can hold a pair of the conductive signal contacts 31 without bringing them in contact with each other, so that their longitudinal axes are parallel. Accordingly, the electrical insulation between the conductive signal contact 31 and the holder substrate 71 is ensured. The insulating glass member 6 has two hollow portions in which two conductive signal contacts 31 are respectively inserted and held, and has a symmetrical cross-sectional shape including these hollow portions. The insulating glass member 6 includes a glass-like member 6a (first glass member) that is inserted into the fourth opening section 54 of the first substrate 72, and a glass-like member 6b (second glass member) having the same shape as the glass-like member 6a and is inserted into the seventh opening section 57 of the second substrate 73.

The insulating glass member 6 is so formed that the largest outer diameter $R_1$ of a surface that is parallel to a surface of the conductive contact holder 4 is made larger than a pitch width r of the conductive contact 3 (the smallest interval between the longitudinal axes of the conductive contacts 3).

To one end of the glass-like members 6a and 6b, locking flanges 61 and 62 that have a larger diameter than the other portions are respectively formed. The glass-like member 6a is inserted into the first substrate 72, so that the locking flange 61 is positioned at a boundary side of the first substrate 72 and the second substrate 73. Meanwhile, the glass-like member 6b is inserted into the second substrate 73 so that the locking flange 62 is positioned at the boundary side of the first substrate 72 and the second substrate 73. Therefore, with the glass-like members 6a and 6b, in the first opening section 51, the ends that respectively have the locking flanges 61 and 62 come into contact with each other. By providing the locking flanges 61 and 62 as such, the locking function of the insulating glass member 6 to the holder substrate 71 is enabled. Also, a positioning accuracy of the conductive signal contact 31 that is inserted into the insulating glass member 6 can be improved.

The hollow portion formed in the glass-like members 6a and 6b has a shape that the inner diameter is narrowed at ends opposite to the ends where the locking flanges 61 and 62 are respectively formed. This shape enables to prevent the conductive signal contacts 31 that are held in the respective hollow portions from slipping out from the surface of the insulating glass member 6.

The thus-structured insulating glass member 6 includes a function to correct the characteristic impedance of the conductive signal contact 31. More specifically, by adjusting the relative permittivity and the shape of the insulating member from which the insulating glass member 6 is formed, the characteristic impedance of the conductive signal contact 31 can match the characteristic impedance of the inspection circuit of the circuit substrate 2 and the semiconductor integrated circuit 100.

The insulating glass member 6, for example, is formed by using foamed polyethylene that contains small air bubbles. It is known that the foamed polyethylene has relative permittivity that decreases with an increase of the ratio of the inside air. To maintain a mechanical strength as the holding member that holds the conductive signal contact 31, the foamed polyethylene having a foaming extent (volume ratio between the air bubble and the polyethylene) of approximately 50% and a relative permittivity of approximately 1.5 is suitable. Also, the insulating glass member 6 may be formed by using fluorine resin such as polytetrafluoroethylene (PTFE) that contains similar minute air bubbles.

The conductive pipe member 7 will now be described. The conductive pipe member 7 is shaped in a substantially cylindrical hollow, and holds good electrical contact between the conductive ground contact 32 and the holder substrate 71. The conductive pipe member 7 includes a pipe-like member 7a that is inserted into the fifth opening section 55 of the first substrate 72 and a pipe-like member 7b having the same shape as the pipe-like member 7a and inserted into the eighth opening section 58 of the second substrate 73. To one end of the pipe-like members 7a and 7b, locking flanges 63 and 64 having a larger outer diameter than the other portions are respectively formed. The ends that are respectively formed with the locking flanges come into contact with each other in the second opening section 52. The hollow portions of the pipe-like members 7a and 7b have a shape that the inner diameter is narrowed at the ends opposite to the ends where the locking flanges are formed, thereby preventing the conductive ground contact 32 from slipping out.

The conductive pipe member 7 having such a shape is made by providing a thin gold film to an inner peripheral surface of a pipe structure that is made of white copper, phosphor bronze, brass, stainless, or the like. By using the conductive pipe member 7 having a smooth inner surface, the dynamic resistance to the telescopic movement of the conductive ground contact 32 is reduced, thereby reducing the electrical contact resistance at the outer periphery of the conductive ground contact 32.

The insulating pipe member 8 is shaped in a substantially cylindrical hollow by an insulating material similar to the insulating glass member 6, and ensures electrical insulation between the conductive power-supply contact 33 and the holder substrate 71. The insulating pipe member 8 includes a pipe-like member 8a that is inserted into the sixth opening section 56 of the first substrate 72, and a pipe-like member 8b having the same shape as the pipe-like member 8a, and inserted into the ninth opening section 59 of the second substrate 73. To one end of the pipe-like members 8a and 8b, locking flanges 65 and 66 having a larger outer diameter than the other portions are respectively formed, and the ends that are respectively formed with the locking flanges come into contact with each other in the third opening section 53. The hollow portions of the pipe-like members 8a and 8b have a shape that the inner diameter is narrowed at the ends opposite to the ends where the locking flanges are formed, thereby preventing the conductive power-supply contact 33 from slipping out.

The pipe-like members 7a and 7b that store therein the conductive ground contact 32, and the pipe-like members 8a and 8b that store therein the conductive power-supply contact 33 have different exterior shapes. More specifically, as shown in FIG. 3, an outer diameter $d_1$ of the locking flange 63 of the pipe-like members 7a and 7b, and an outer diameter $d_3$ of the locking flange 65 of the pipe-like members 8a and 8b satisfy a relationship of $d_1 > d_3$. An outer diameter $d_2$ of a pipe portion of the pipe-like members 7a and 7b, and an outer diameter $d_4$ of the pipe portion of the pipe-like members 8a and 8b satisfy a relationship of $d4 > d2$.

Therefore, the conductive pipe member 7 can be properly inserted into the second opening section 52 only, and the insulating pipe member 8 can be properly inserted into the third opening section 53 only. As a result, for example, the conductive power-supply contact 33 is prevented from being accidentally inserted into the conductive pipe member 7. The accidental insertion causes a direct grounding of the circuit substrate 2 and an output power-supply terminal and the like of the semiconductor integrated circuit 100 via the conductive power-supply contact 33, thereby generating a large current flow. Thus, the circuit substrate 2 and the semiconductor integrated circuit 100 can be prevented from being damaged to an unusable extent.

In terms of preventing the accidental insertion to the conductive pipe member 7 or the insulating pipe member 8, the pipe insertion direction length of the locking flanges 63 and 64 that are formed to the pipe-like members 7a and 7b, and the pipe insertion direction length of the locking flanges 65 and 66 that are formed to the pipe-like members 8a and 8b may be respectively formed so as to take different values.

An assembling method of the thus-structured conductive contact unit 1 will now be described. First, the holding members that respectively correspond to each opening section formed to the first substrate 72 and the second substrate are inserted. Thereafter, in a state that the first substrate 72 is arranged so as the semiconductor integrated circuit 100 side is vertically downward (that is, a boundary surface to the second substrate 73 is vertically upward), the conductive contacts 3 are stored correspondingly in the hollow portions of the respective holding members. Subsequently, the first substrate 72 and the second substrate 73 are fixed to each other, by superimposing the second substrate 73 to the first substrate 72 so as to cover from vertical up position. Thereafter, the conductive contact unit 1 is completed by further assembling members such as the circuit substrate 2 and the holder member 5.

As described above, the assembly of the conductive contact unit 1 is easy and suitable for mass production. Because it is configured so that the locking flanges restrain the holding members, the holding members can easily be detached from the opening sections, by releasing the fixed state of the first substrate 72 and the second substrate 73. Further, by releasing the fixed state of the first substrate 72 and the second substrate 73, the conductive contacts 3 can also easily be detached, thereby allowing easy maintenance.

According to the first embodiment, the conductive contact unit 1 is applied to a circuit structure that performs differential transmission, which is one of high-frequency transmission systems. The differential transmission is a mode of transmitting signals using a pair of conductive signal contacts 31 as a circuit connected in series, and requires a characteristic impedance of 100 ohms.

Figure 4:
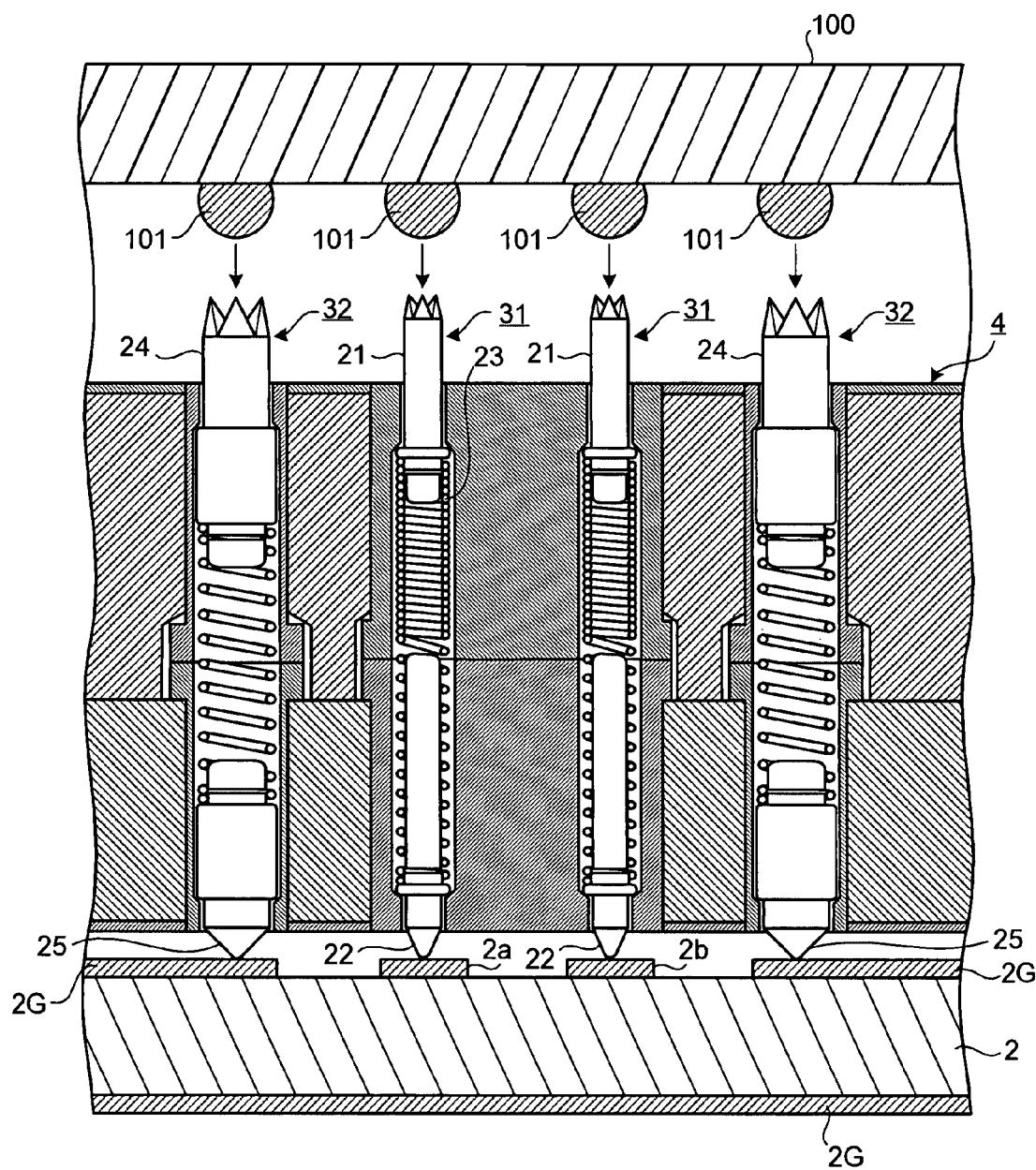
FIG. 4 is an explanatory diagram for explaining mounting of a semiconductor integrated circuit when the conductive contact unit according to the first embodiment of the present invention is applied to differential transmission.

FIG. 4 is a diagram for explaining mounting of the conductive contact holder 4 according to the first embodiment on the semiconductor integrated circuit 100 that performs the differential transmission of high-frequency signals. The conductive contact holder 4 shown in the diagram corresponds to a cross-section along a line A'-A' of FIG. 2. As shown in FIG. 4, ends of the needle-like member 21 of the conductive signal contact 31 and the needle-like member 24 of the conductive ground contact 32 come into contact with a substantially spherical connecting electrode (bump) 101 that is formed to the semiconductor integrated circuit 100.

Meanwhile, sharp-pointed tips of the needle-like member 22 of the conductive signal contact 31 and the needle-like member 25 of the conductive ground contact 32 come into contact with prescribed electrodes provided on a surface of the circuit substrate 2. As shown in FIG. 4, a coplanar microstrip line for differential transmission is applied as the circuit structure of the circuit substrate 2. In the microstrip line, signal electrodes 2a and 2b, and a ground electrode 2G are arranged on both surfaces of the circuit substrate 2, and the ground electrode 2G is arranged on the entire surface of one of the two surfaces (the surface positioned vertically downward in FIG. 4). The sharp-pointed tips of the needle-like members 22 of the two conductive signal contacts 31 respectively come into contact with the signal electrodes 2a and 2b provided on the surface of the microstrip line, and transmit and receive electrical signals. The needle-like member 25 of the conductive ground contact 32 comes into contact with the ground electrode 2G provided on the same surface of the circuit substrate 2 as the surface provided with the signal electrodes 2a and 2b.

The characteristic impedance of the conductive signal contact 31 from which a transmission path is formed in the differential transmission depends on the relative permittivity of the insulating glass member 6 that holds the conductive signal contact 31, a cross-sectional area of the insulating glass member 6, and the like. Therefore, the outer diameter of the conductive signal contact 31 can be made larger approximately by 10 to 20% as compared with when the insulating glass member 6 is formed using Teflon (registered trademark) with a relative permittivity of 2.1. The comparison is made by keeping the pitch width r of the conductive contacts 3 fixed and forming the insulating glass member 6 by using an insulating material with a relative permittivity of approximately 1.5 (for example, the fluorine resin such as foamed polyethylene and PTFE).

The outer diameter of the conductive signal contact 31 can be made larger approximately by 30% to 90% as compared with when the pair of conductive signal contacts 31 are individually held in a conventional insulating pipe member of a cylindrical hollow. The comparison is made by using the insulating member with the same relative permittivity and the same pitch width r. In this case, the conventional insulating pipe member of a cylindrical hollow means the one whose surface circle diameter is smaller than the pitch width r of the conductive contact 3.

Therefore, the conductive contact unit 1 according to the first embodiment can increase the strength of the conductive signal contact 31 by making its diameter larger than conventional ones, by providing the insulating glass member 6 that collectively holds the pair of conductive signal contacts 31 in the differential transmission. As a result, the high-frequency-signal transmission characteristics of the conductive signal contact 31 can also be improved, thereby enabling to deal with higher-speed circuit operation of the inspection subject.

When the conductive contact holder 4 is applied to the differential transmission, the ground electrode 2G that transmits signals, as shown in FIG. 4 is not essential. Therefore, even if the ground electrode 2G cannot be placed due to the structure of the semiconductor integrated circuit 100, an application is possible.

According to the first embodiment of the present invention, the conductive contact holder and the conductive contact unit including the holder substrate that is made of a conductive material and has the first opening section formed thereon that holds the conductive signal contacts that input and output signals to and from a prescribed circuit structure, and the holding member that is made of an insulating material, inserted into the first opening section, and holds at least one of the conductive signal contacts can be provided. The conductive contact holder and the conductive contact unit are applicable even when the circuit structure of an inspection subject transmits high-frequency signals, and are excellent in strength and durability, by making the largest outer diameter of the holding member surface parallel to the surface of the conductive contact holder larger than the smallest interval between the longitudinal axes of the conductive signal contacts held the conductive contact holder.

Modifications of First Embodiment

Figure 5:
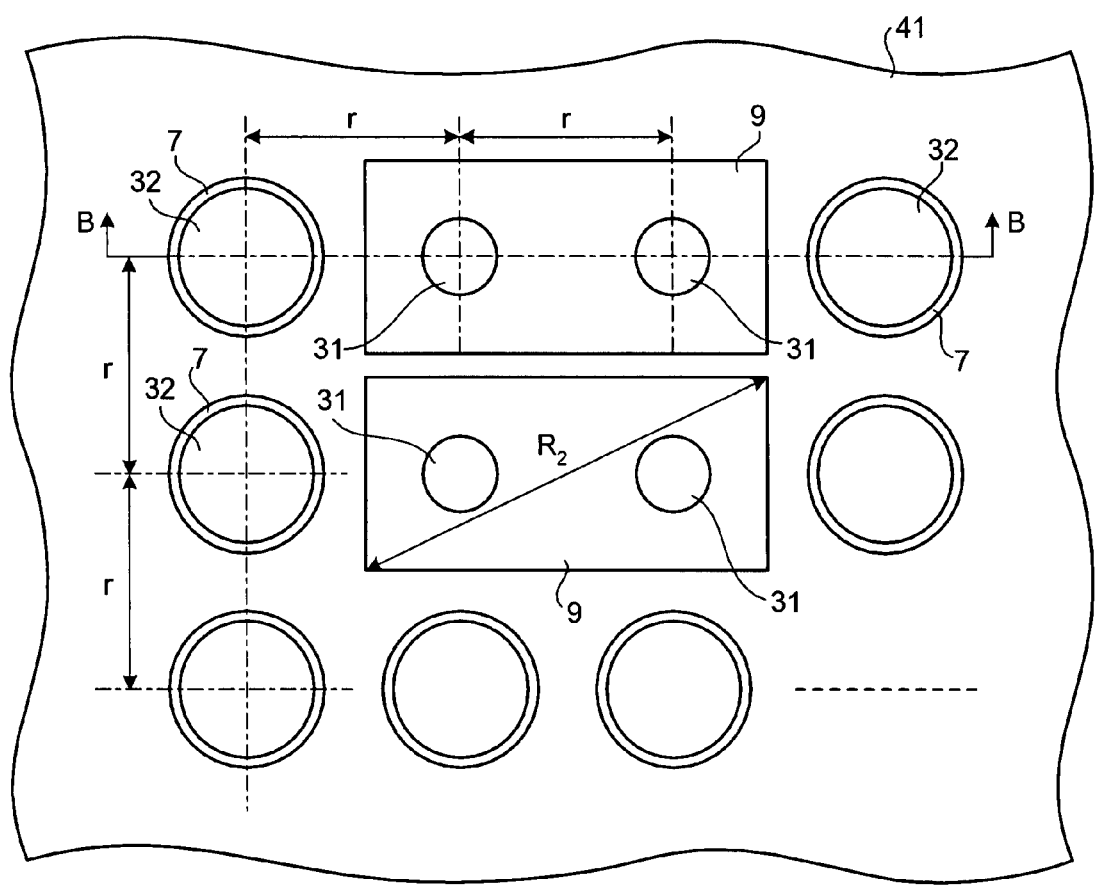
FIG. 5 is a top view of a partial configuration of a conductive contact holder according to a modification (first modification example) of the first embodiment of the present invention.
Figure 6:
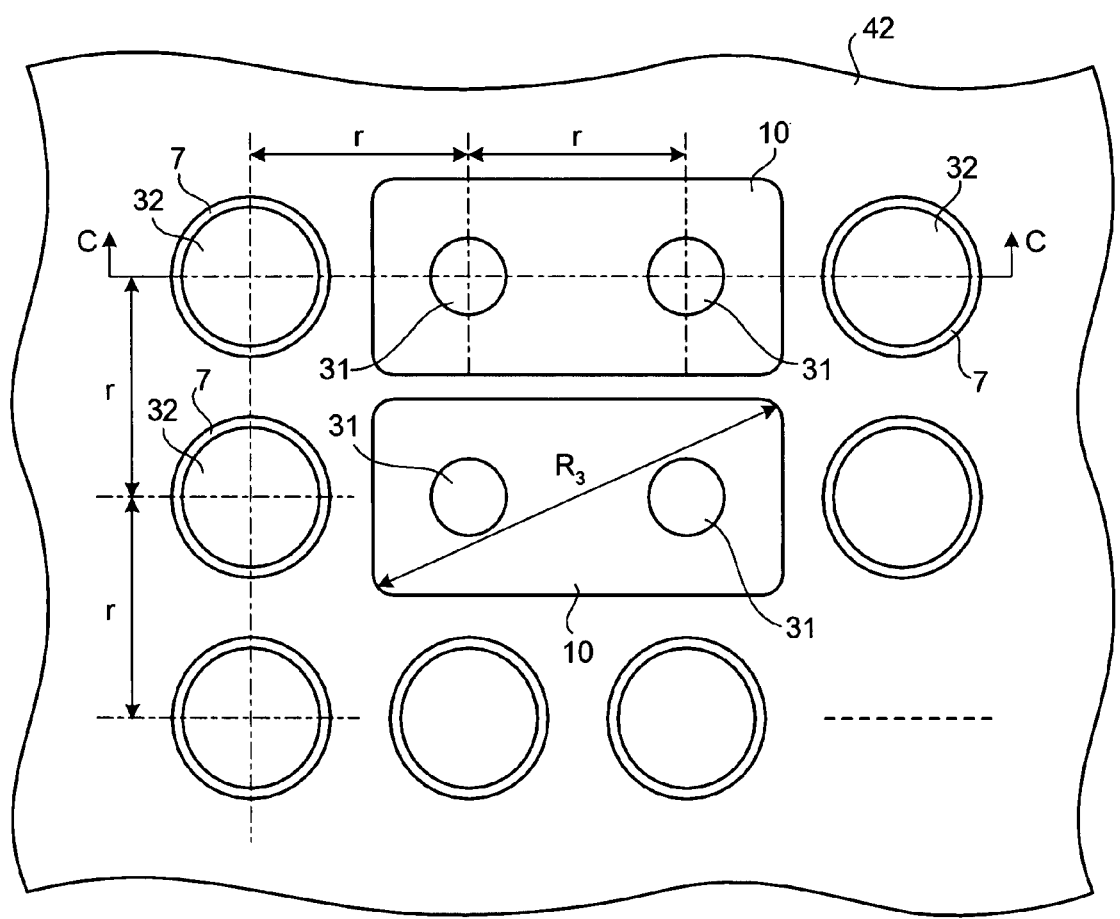
FIG. 6 is a top view of a partial configuration of a conductive contact holder according to another modification (second modification example) of the first embodiment of the present invention.
Figure 7:
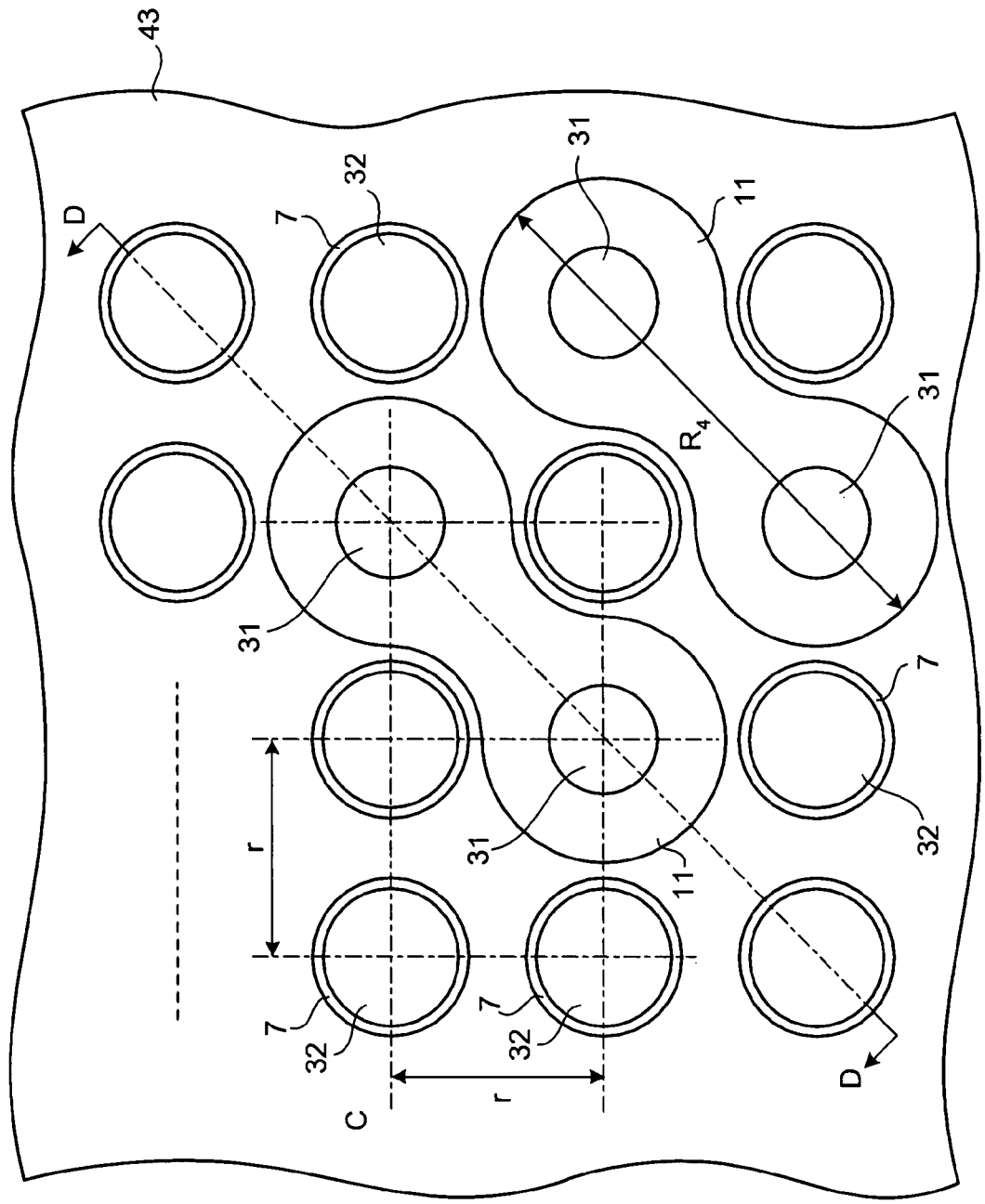
FIG. 7 is a top view of a partial configuration of a conductive contact holder according to still another modification (third modification example) of the first embodiment of the present invention.

To the first embodiment, various modifications may be made. FIGS. 5 to 7 are top views showing partial configurations of conductive contact holders according to modifications of the first embodiment. In a conductive contact holder 41 shown in FIG. 5, an insulating glass member 9 has a rectangular cross-section. The configuration of the conductive contact holder 41 other than this is the same as the configuration of the conductive contact holder 4 described above. Therefore, a cross-section along a line B-B of FIG. 5 is the same as in FIG. 3. The largest outer diameter $R_2$ of the surface of the insulating glass member 9 that is parallel to the surface of the conductive contact holder 41 is made larger than the pitch width r of the conductive contact 3.

In a conductive contact holder 42 shown in FIG. 6, an insulating glass member 10 has a substantially rectangular cross-section with rounded corners. The configuration of the conductive contact holder 42 other than this is the same as the configuration of the conductive contact holder 4. A cross-section along a line C-C of FIG. 6 is the same as in FIG. 3. The largest outer diameter $R_3$ of the surface of the insulating glass member 10 that is parallel to the surface of the conductive contact holder 42 is made larger than the pitch width r of the conductive contact 3.

A conductive contact holder 43 shown in FIG. 7 has an insulating glass member 11 in a diagonal direction, with a cross-section of a gourd shape. In this case, when it is assumed that the same pitch width r as shown in FIG. 3 is given, the cross-sectional area of the insulating glass member 11 can be made larger than the other insulating glass members. In the conductive contact holder 43, a cross-section along a line D-D of FIG. 7 has the same configuration as the one shown in FIG. 3. Also in this case, the largest outer diameter $R_4$ of the surface of the insulating glass member 11 that is parallel to the surface of the conductive contact holder 43 is made larger than the pitch width r of the conductive contact 3.

It is apparent that the conductive contact holders 41 to 43, and the conductive contact unit that is formed by using either one of the conductive contact holders 41 to 43 offer the same advantages as the first embodiment does.

Second Embodiment

Figure 8:
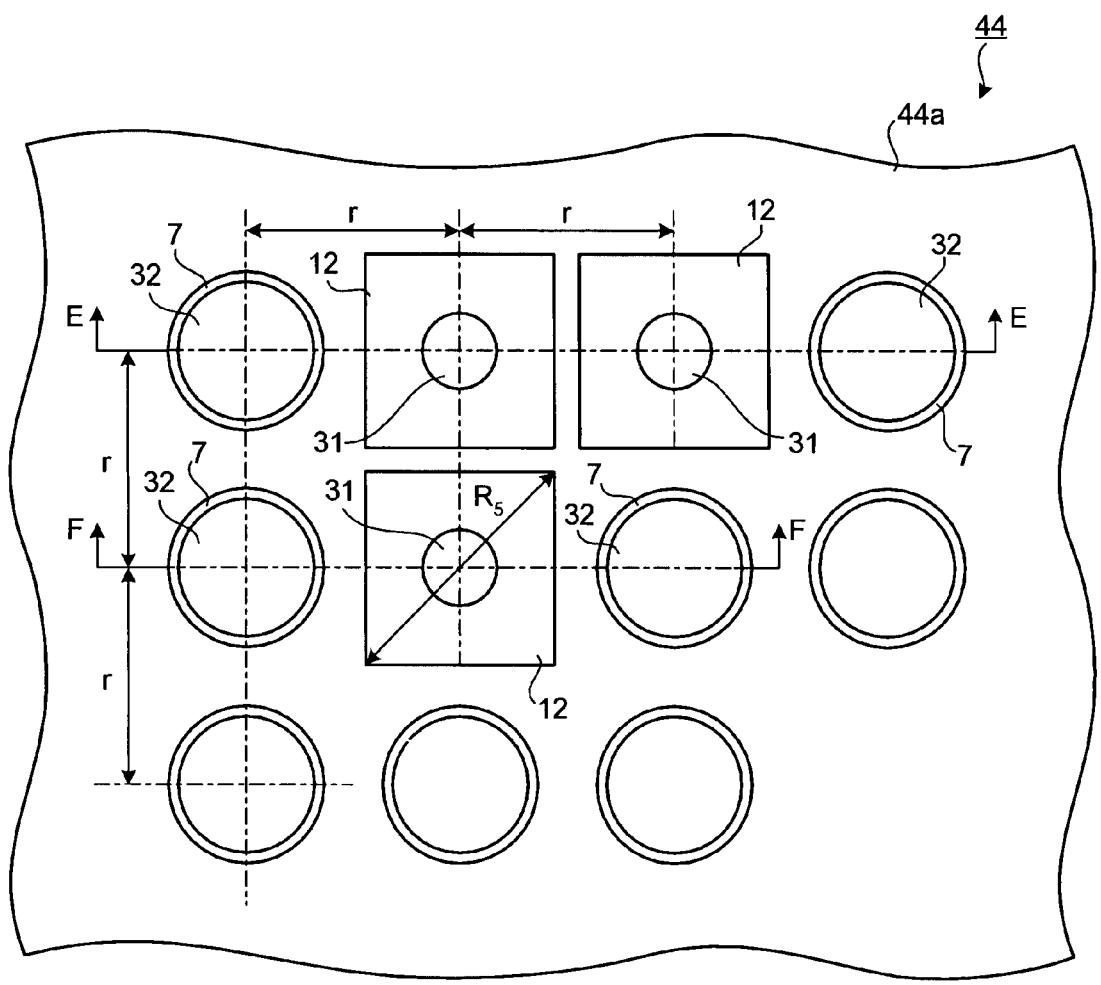
FIG. 8 is a diagram of a configuration of a conductive contact holder and conductive contacts that form a conductive contact unit according to a second embodiment of the present invention.
Figure 9:
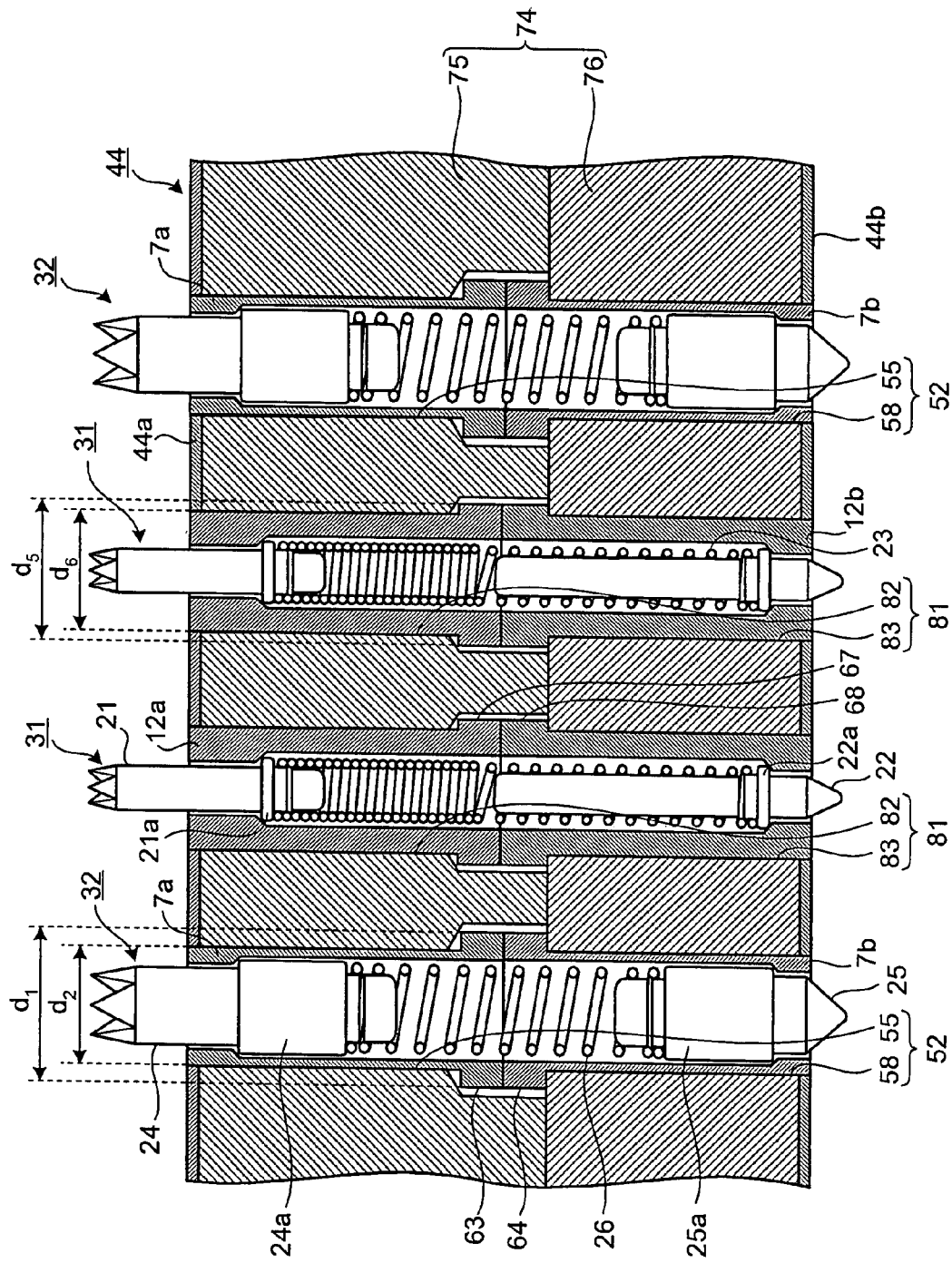
FIG. 9 is a cross-section along a line E-E of FIG. 8.

FIG. 8 is a top view of a partial configuration of a conductive contact holder according to a second embodiment of the present invention. FIG. 9 is a cross-section along a line E-E of FIG. 8. A conductive contact holder 44 shown in these diagrams holds the conductive contacts 3 (including the conductive signal contact 31, the conductive ground contact 32, and the conductive power-supply contact 33) in matrix, corresponding to the circuit structure of an inspection subject.

The conductive contact holder 44 includes a holder substrate 74 that is made of a conductive material, and insulating members 44a and 44b that coat a surface region of the holder substrate 74. The holder substrate 74 has a configuration of superimposing a first substrate 75 and a second substrate 76, like the holder substrate 71 according to the first embodiment. The conductive contact holder 44 is made by inserting the holding members that hold the conductive contacts 3 into the opening sections provided to the holder substrate 74. Three types of such holding members are provided, i.e., an insulating pipe member 12 that holds the conductive signal contact 31, the conductive pipe member 7 that holds the conducive ground contact 32, and the insulating pipe member 8 (not shown) that holds the conductive power-supply contact 33.

In the second embodiment, the holding member that holds the conductive signal contact 31 is different from the first embodiment. In other words, in the second embodiment, the conductive signal contacts 31 are individually stored by the insulating pipe member 12.

The insulating pipe member 12 is shaped in a substantially cylindrical hollow, and ensures electrical insulation between the conductive signal contact 31 and the holder substrate 74. The insulating pipe member 12 includes a pipe-like member 12a that is inserted into a fourth opening section 82 of the first substrate 75, and a pipe-like member 12b having the same shape as the pipe-like member 12a and inserted into a seventh opening section 83 of the second substrate 76. It is apparent that a first opening section 81 that holds the conductive signal contact 31 is formed by communicating the fourth opening section 82 with the seventh opening section 83.

Between surfaces of the pipe-like members 12a and 12b, the surface that is parallel to the surface of the conductive contact holder 44 is formed in a square. Therefore, the largest outer diameter $R_5$ that is larger than the pitch width r of the conductive contact 3 can be provided, thereby enabling to further largely correct the characteristic impedance. As a result, as hereinafter described, the diameter of the conductive signal contact 31 can be made larger.

To one end of the pipe-like members 12a and 12b, locking flanges 67 and 68 having a larger outer diameter than the other portions are respectively formed. The pipe-like member 12a is inserted into the first substrate 75 so that the locking flange 67 is positioned at a boundary side of the first substrate 75 and the second substrate 76. Meanwhile, the pipe-like member 12b is inserted into the second substrate 76 so that the locking flange 68 is positioned at the boundary side of the first substrate 75 and the second substrate 76. Therefore, the ends of the pipe-like members 12a and 12b that respectively include the locking flanges 67 and 68 come into contact with each other, in the first opening section 81. The locking flanges 67 and 68 offer the same advantages as the locking flange provided to each type of the holding members in the first embodiment.

The hollow portions formed in the pipe-like members 12a and 12b have a shape that an inner diameter is narrowed at the ends opposite from the ends where the locking flanges 67 and 68 are respectively formed. This shape enables to prevent the conductive signal contacts 31 that are held in the hollow portions from slipping out from the surface of the insulating pipe member 12.

The pipe-like members 7a and 7b that store therein the conductive ground contact 32 have different exterior shapes from those of the pipe-like members 12a and 12b that store therein the conductive signal contact 31. As shown in FIG. 9, the outer diameter $d_1$ of the locking flange 63 of the pipe-like members 7a and 7b, and an outer diameter $d_5$ of the locking flange 65 of the pipe-like members 12a and 12b satisfy a relationship of $d_1>d_5$. The outer diameter $d_2$ of the pipe portion of the pipe-like members 7a and 7b and an outer diameter $d_6$ of the pipe portion of the pipe-like members 12a and 12b satisfy a relationship of $d_6>d_2$. Therefore, the conductive pipe member 7 can be properly inserted into the second opening section 52 only, and the insulating pipe member 12 can be properly inserted into the first opening section 81 only.

The configurations and the operations of the conductive pipe member 7 that holds the conductive ground contact 32 and the insulating pipe member 8 that holds the conductive power-supply contact 33 are the same as in the first embodiment. The insulating pipe member 12 may be used as the insulating holding member that holds the conductive power-supply contact 33. In this case, the shape of the opening section provided to the holder substrate 74 will be changed accordingly.

The conductive contact holder 44 according to the second embodiment can be applied to the circuit structure that performs the differential transmission of high-frequency signals, as in the first embodiment. In this case, a state when the semiconductor integrated circuit 100 is mounted on the conductive contact unit that is formed with the conductive contact holder 44 shown in FIG. 9 and a configuration (including the coplanar microstrip line for differential transmission) of the circuit substrate 2 are the same as those shown in FIG. 4.

Figure 10:
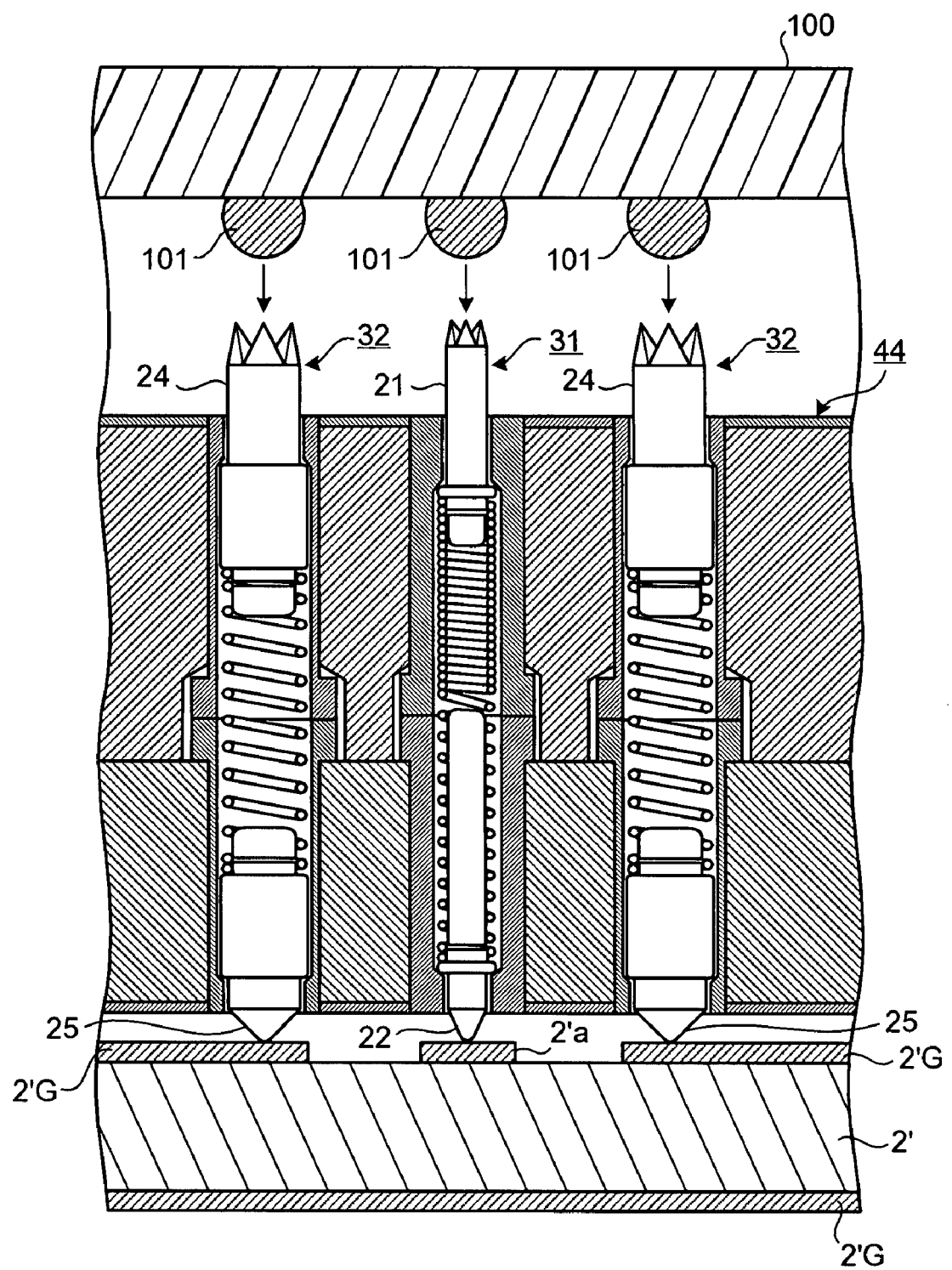
FIG. 10 is an explanatory diagram for explaining mounting of a semiconductor integrated circuit when the conductive contact holder according to the second embodiment of the present invention is applied to single-ended transmission.

The conductive contact holder 44 may be applied to single-ended transmission. The single-ended transmission is a mode of transmitting signals using the conductive signal contact 31 and the conductive ground contact 32 for ground as a circuit, and usually requires a characteristic impedance of 50 ohms. FIG. 10 is a diagram showing a state when the conductive contact holder 44 according to the second embodiment is mounted on the semiconductor integrated circuit 100 that performs the single-ended transmission of high-frequency signals. The conductive contact holder 44 shown in the diagram corresponds to a cross-section along a line F-F of FIG. 8. As shown in FIG. 10, the sharp-pointed tip of the needle-like member 22 of the conductive signal contact 31 comes into contact with a signal electrode 2'a of the coplanar microstrip line for single-ended transmission as a circuit substrate 2'. Meanwhile, the sharp-pointed tip of the needle-like member 25 of the conductive ground contact 32 comes into contact with a ground electrode 2'G of the circuit substrate 2'.

In this single-ended transmission, the outer diameter of the conductive signal contact 31 may be increased approximately by 10 to 20% as compared with when the insulating pipe member 12 is formed using the Teflon (registered trademark) with a relative permittivity of 2.1. The comparison is made by keeping the pitch width r of the conductive contact 3 fixed, and using an insulating material with a relative permittivity of approximately 1.5. The outer diameter of the conductive signal contact 31 may be increased approximately by 20 to 70% as compared with when the conductive signal contact 31 is individually held in a conventional insulating pipe member of a cylindrical hollow. The comparison is made by using the insulating member with the same relative permittivity and the same pitch width r.

According to the second embodiment of the present invention, by forming the surface of the insulating pipe member that holds the conductive signal contact into a square shape, as in the first embodiment, the conductive contact holder and the conductive contact unit that are applicable even when the circuit structure of an inspection subject transmits high-frequency signals and are excellent in strength and durability can be provided.

Also, according to the second embodiment, by using the insulating pipe members that each holds one conductive signal contact, the transmission system of inputting and outputting signals may be applied to either the single-ended transmission or the differential transmission.

Modifications of Second Embodiment

Figure 11:
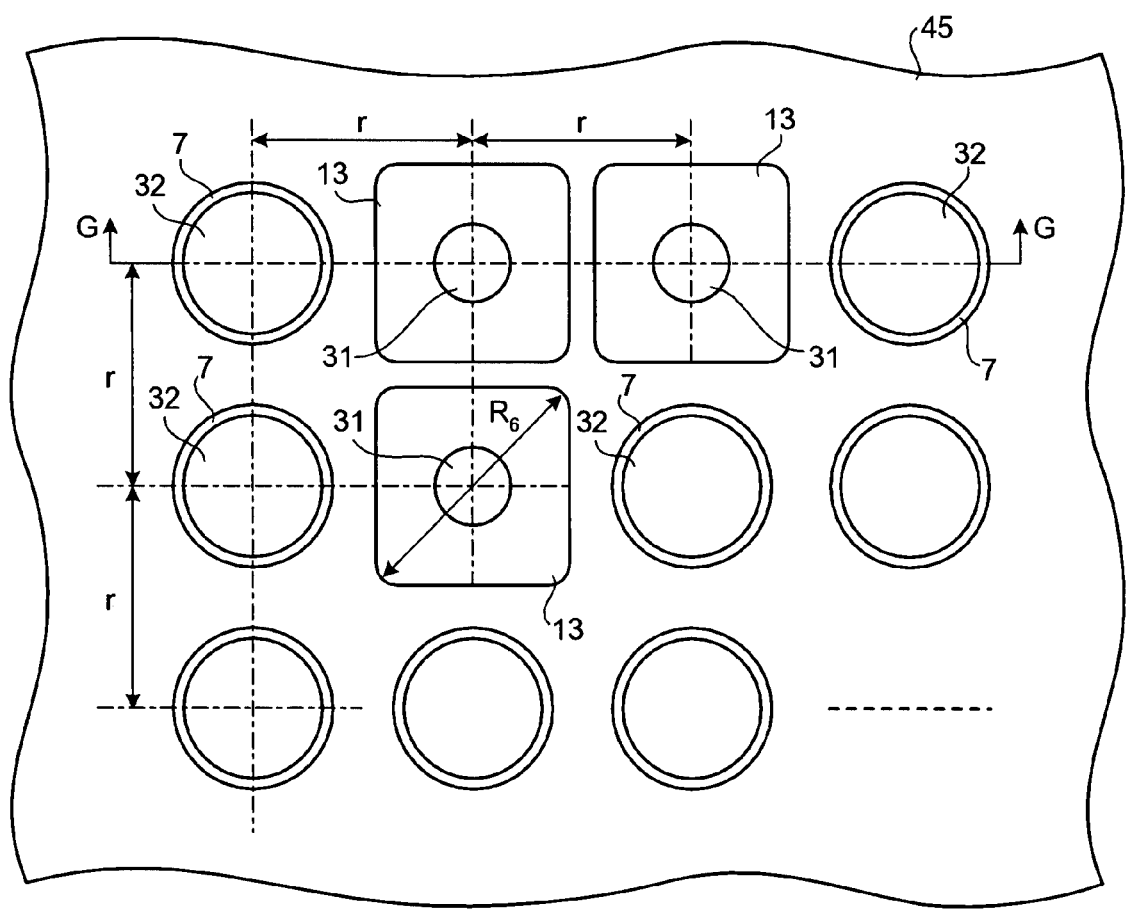
FIG. 11 is a top view of a partial configuration of a conductive contact holder according to a modification (first modification example) of the second embodiment of the present invention.
Figure 12:
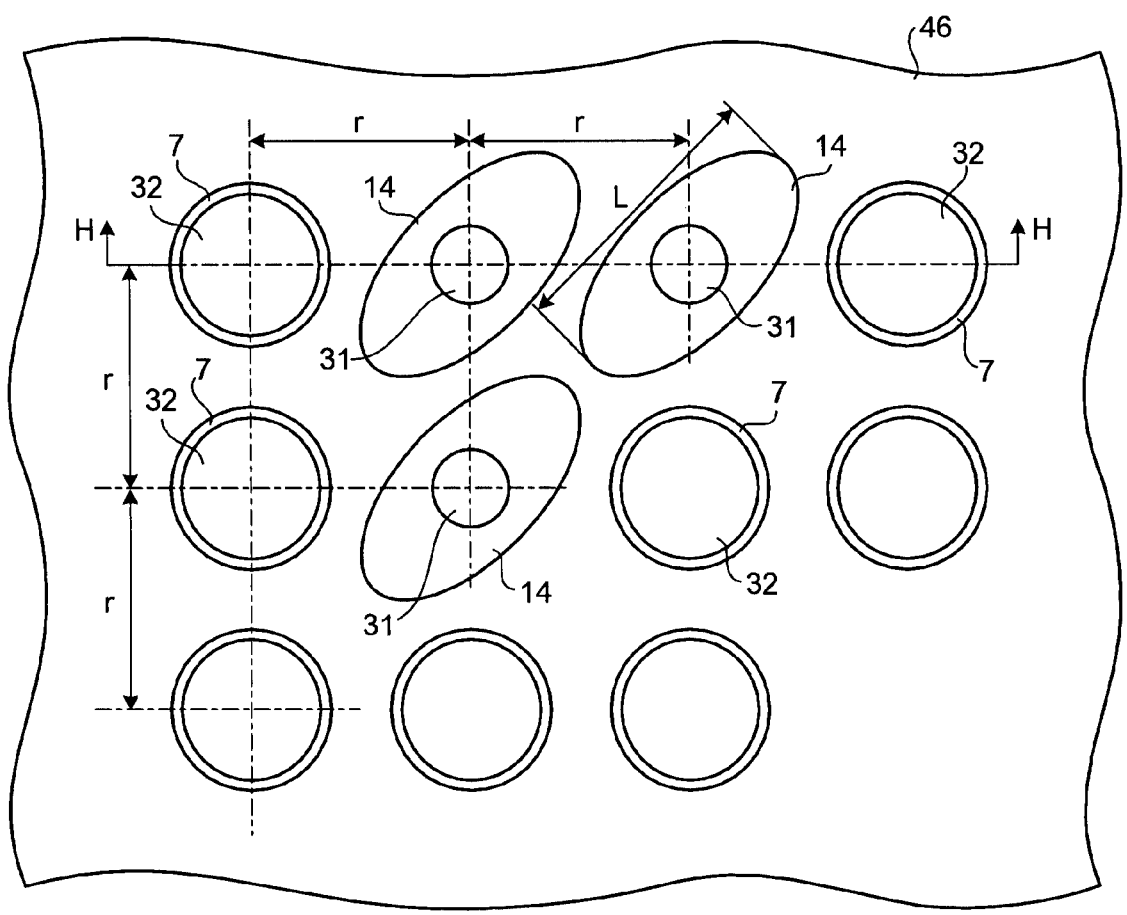
FIG. 12 is a top view of a partial configuration of a conductive contact holder according to another modification (second modification example) of the second embodiment of the present invention.
Figure 13:
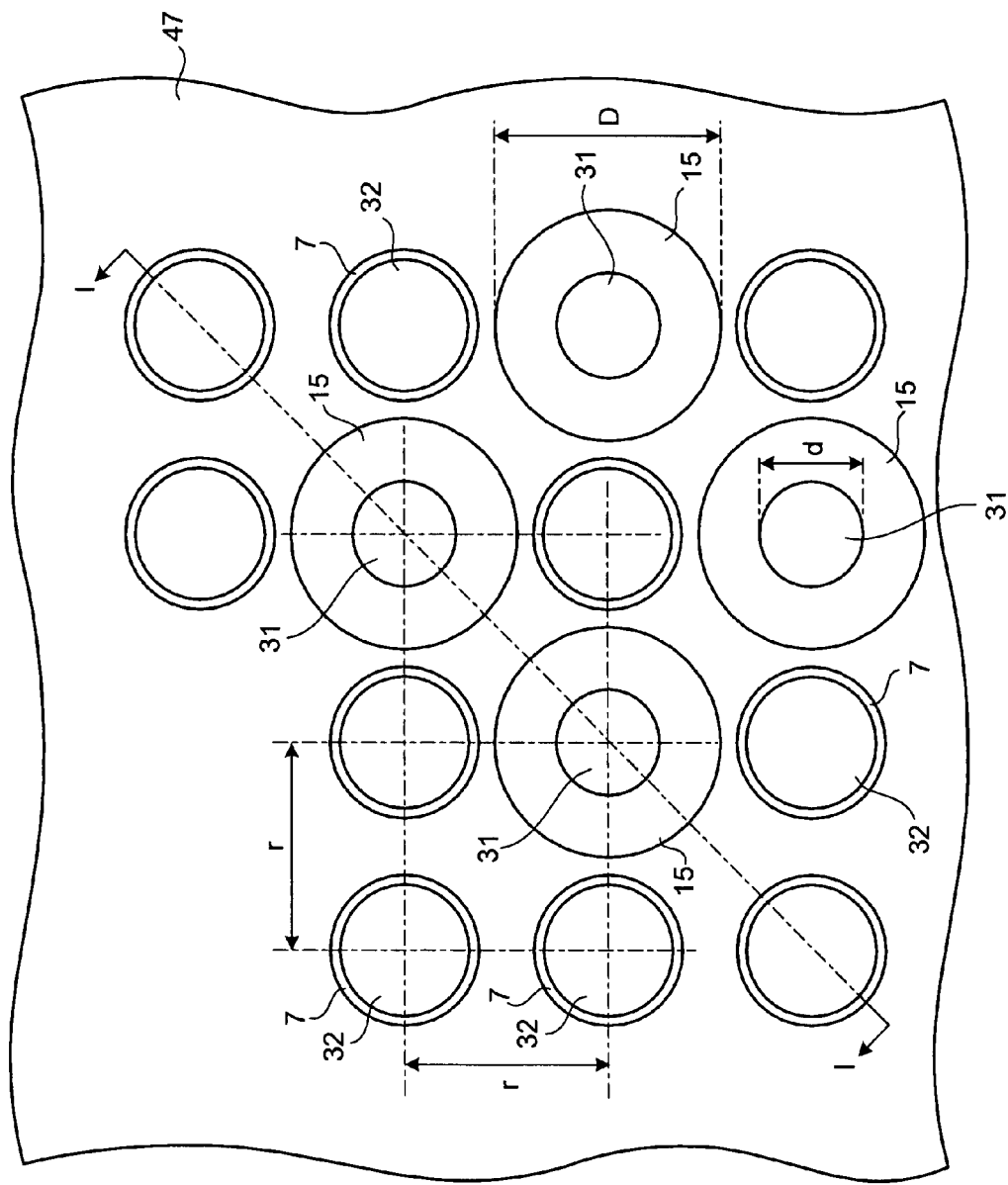
FIG. 13 is a top view of a partial configuration of a conductive contact holder according to still another modification (third modification example) of the second embodiment of the present invention.

The second embodiment of the present invention can be modified in various ways. FIGS. 11 to 13 are top-views showing partial configurations of conductive contact holders according to modifications of the present embodiment. In a conductive contact holder 45 shown in FIG. 11, an insulating pipe member 13 that holds the conductive signal contact 31 has a substantially square cross-section with rounded corners. The configuration of the conductive contact holder 45 other than this is the same as the configuration of the conductive contact holder 44. Therefore, a cross-section along a line G-G of FIG. 11 is the same as in FIG. 8. The largest outer diameter $R_6$ of the surface of the insulating pipe member 13 that is parallel to the surface of the conductive contact holder 45 is made larger than the pitch width r of the conductive contact 3.

In a conductive contact holder 46 shown in FIG. 12, an insulating pipe member 14 that holds the conductive signal contact 31 has an elliptic cross-section. In this case, the characteristic impedance of the conductive signal contact 31 may be corrected more largely by inclining the ellipse at a prescribed angle from a pitch direction. This enables to make a major axis L (the largest diameter of the surface of the insulating pipe member 14 that is parallel to the surface of the conductive contact holder 46) larger than the pitch width r. The configuration of the conductive contact holder 46 other than this is the same as the configuration of the conductive contact holder 44, and a cross-section along a line H-H of FIG. 12 is the same as in FIG. 8.

In a conductive contact holder 47 shown in FIG. 13, insulating pipe members 15 each having a cylindrical hollow shape are arranged in a diagonal direction of the conductive contact holder 4. In the insulating pipe member 15 having such a shape, with a relative permittivity $\epsilon_r$ of the insulating material from which the insulating pipe member 15 is formed, an outer diameter D of the cylindrical shape, and an outer diameter d of the conductive signal contact 31, a characteristic impedance $Z_0$ at the conductive signal contact 31 is as follows:

[Equation 1]

$$Z_0 = \frac{138}{\sqrt{\epsilon_r}} \log_{10} \frac{D}{d} \quad (1)$$

The outer diameter D of the cylindrical shape can be made larger than the pitch width r by adjoining the insulating pipe members 15 in the diagonal direction. Therefore, as is evident from Equation (1), when the characteristic impedance $Z_0$ is kept constant, the outer diameter d of the conductive signal contact 31 can be made larger, if the outer diameter D of the cylindrical shape is made larger. In the conductive contact holder 47, a cross-section along a line I-I of FIG. 13 is the same as the configuration shown in FIG. 8.

It is apparent that the conductive contact holders 45 to 47, and the conductive contact unit that is formed by using either one of the conductive contact holders 45 to 47 offer the same advantages as the second embodiment does.

Other Embodiments

Figure 14:
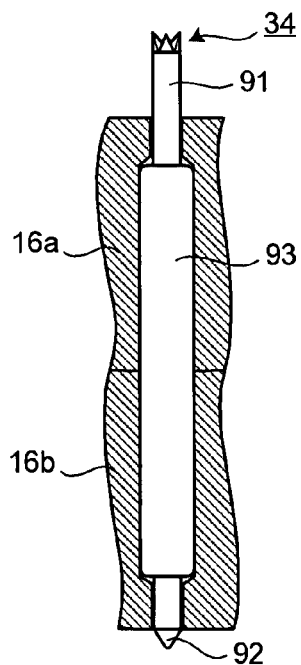
FIG. 14 is a diagram showing another configuration of a conductive signal contact.

While the first and the second embodiments have been described in detail as the best modes for carrying out the invention, the present invention should not be limited to the two embodiments. FIG. 14 is a schematic diagram showing a configuration when a barrel-shaped conductive contact that incorporates a spring member and the like is used as a conductive signal contact. A conductive signal contact 34 shown in the diagram includes needle-like members 91 and 92 respectively having the same shapes as the needle-like members 21 and 22 of the conductive signal contact 31. The conductive signal contact 34 also includes a pipe body 93 that is formed so as to cover a part of bases of the needle-like members 91 and 92, and a spring member (not shown). The exterior of the conductive signal contact 34 is a cylindrical shape.

The pipe body 93 maintains a state of electrically connecting to the needle-like members 91 and 92, for example, by having an internal diameter approximately equal to the outer diameter of the needle-like members 91 and 92. The position, the shape, and the like do not change when the needle-like members 91 and 92 slide. Therefore, the inner surfaces of pipe-like members 16a and 16b that are in contact with the outside surface of the pipe body 93 do not need to be smoothed, thereby increasing flexibility in selecting the shape and the material of the pipe-like members 16a and 16b. The conductive signal contact 34 may be applied as a conductive power-supply contact.

Figure 15:
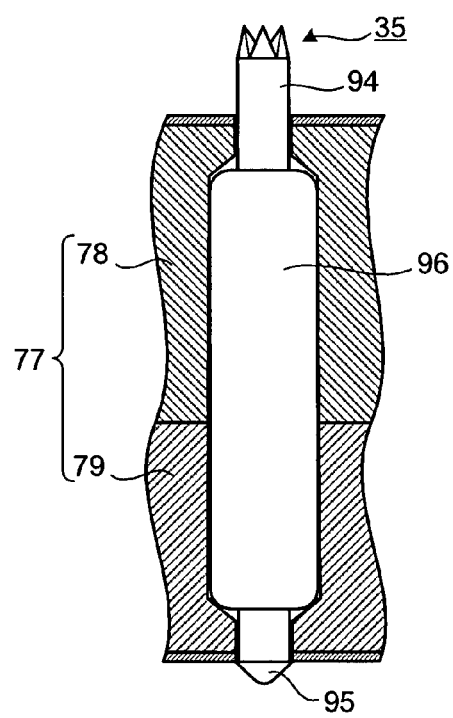
FIG. 15 is a diagram showing another configuration of a conductive ground contact.

FIG. 15 is a schematic diagram showing a configuration when the conductive ground contact is barrel-shaped. A conductive ground contact 35 shown in the diagram includes needle-like members 94 and 95, and a pipe body 96 that is formed so as to cover a part of bases of the needle-like members 94 and 95, and a spring material (not shown), having an exterior of a cylindrical shape. In the conductive ground contact 35, because an area contacting with the surrounding is large, the electrical contact resistance can be reduced. Therefore, the conductive ground contact 35 can be contacted directly with a first substrate 78 and a second substrate 79 forming a holder substrate 77 without being held by the conductive pipe member.

The shapes of the conductive contacts described above are only examples, and the present invention can be also applied to conductive contacts formed in other shapes. In the above explanation, it is assumed that the conductive contact units are used for inspecting a semiconductor integrated circuit. However, the present invention can also be applied to apparatuses that detect electrical characteristics of a liquid crystal panel and the like.

Accordingly, the present invention may include various embodiments that are not described herein, and various changes in design can be made without departing from the scope of the invention as defined in the claims appended hereto.

INDUSTRIAL APPLICABILITY

As described above, the conductive contact holders and the conductive contact units according to the present invention are suitable for performing a burn-in test on a prescribed circuit structure such as a semiconductor integrated circuit.

The invention claimed is:

1. A conductive contact holder that holds conductive signal contacts for exchanging signals with a detection-target circuit, the conductive contact holder comprising:
a holding member made of an insulating material and having two hollow portions for holding a pair of the conductive signal contacts such that the conductive signal contacts are not in electric contact with each other and the longitudinal axes of the conductive signal contacts are parallel to each other; and
a holder substrate made of a conductive material and having a first opening section configured to hold the holding member,
wherein largest diameter of of the holding member in a direction that is parallel to a surface of the conductive contact holder is larger than an interval between the two hollow portions.

2. The conductive contact holder according to claim 1, wherein the holder substrate includes
a first substrate having a fourth opening section and a fifth opening section respectively corresponding to the first opening section and the second opening section; and
a second substrate having a seventh opening section and an eighth opening section respectively corresponding to the first opening section and the second opening section, and fixed to the first substrate so that the seventh opening section communicates with the fourth opening section and the eighth opening section communicates with the fifth opening section; and
the insulating glass member includes
a first glass-like member inserted into the fourth opening section; and
a second glass-like member having the same shape as the first glass-like member, and inserted into the seventh opening section.

3. The conductive contact holder according to claim 2, wherein the first and the second glass-like members are respectively formed with a locking flange to one end, and respectively inserted into the fourth opening section and the seventh opening section so that the locking flange is positioned at a boundary side of the first substrate and the second substrate.

4. The conductive contact holder according to claim 1, wherein
the holder substrate further includes a third opening section for holding a conductive power-supply contact that supplies electrical power to the detection-target circuit, and
in the third opening section, an insulating pipe member made of an insulating material and holding the conductive power-supply contact is inserted.

5. A conductive contact holder that holds conductive signal contacts for exchanging signals with a detection-target circuit and a conductive ground contact for supplying a ground potential to the detection-target circuit, the conductive contact holder comprising:
a holding member made of an insulating material and having two hollow portions for holding a pair of the conductive signal contacts such that the conductive signal contacts are not in electric contact with each other and the longitudinal axes of the conductive signal contacts are parallel to each other; and
a holder substrate made of a conductive material and having a first opening section configured to hold the conductive signal contacts and a second opening section configured to hold the conductive ground contact while maintaining an electrical connection with the conductive ground contact; and
wherein largest outer diameter of the holding member in a direction that is parallel to a surface of the conductive contact holder is larger than an interval between the two hollow portions.

6. The conductive contact holder according to claim 5, wherein the holder substrate includes
a first substrate having a fourth opening section and a fifth opening section respectively corresponding to the first opening section and the second opening section; and
a second substrate having a seventh opening section and an eighth opening section respectively corresponding to the first opening section and the second opening section, and fixed to the first substrate so that the seventh opening section communicates with the fourth opening section and the eighth opening section communicates with the fifth opening section; and
the insulating glass member includes
a first glass-like member inserted into the fourth opening section; and
a second glass-like member having the same shape as the first glass-like member, and inserted into the seventh opening section.

7. The conductive contact holder according to claim 6, wherein the first and the second glass-like members are respectively formed with a locking flange to one end, and respectively inserted into the fourth opening section and the seventh opening section so that the locking flange is positioned at a boundary side of the first substrate and the second substrate.

8. The conductive contact holder according to claim 5, further comprising a conductive pipe member made of a conductive material, configured to be inserted into the second opening section for holding the conductive ground contact.

9. The conductive contact holder according to claim 5, wherein
the holder substrate further includes a third opening section for holding a conductive power-supply contact that supplies electrical power to the detection-target circuit, and
in the third opening section, an insulating pipe member made of an insulating material and holding the conductive power-supply contact is inserted.

10. A conductive contact unit comprising:
conductive signal contacts that input and output a signal to and from a prescribed detection-target circuit;
a conductive ground contact that supplies a ground potential to the detection-target circuit;
a conductive contact holder including
a holding member made of an insulating material and having two hollow portions for holding a pair of the conductive signal contacts such that the conductive signal contacts are not in electric contact with each other and the longitudinal axes of the conductive signal contacts are parallel to each other,
a holder substrate made of a conductive material and having a first opening section configured to hold the conductive signal contacts and a second opening section configured to hold the conductive ground contact while maintaining an electrical connection with the conductive ground contact; and
a circuit substrate electrically connected at least to the conductive signal contacts and including a circuit that produces a signal to be input to the detection-target circuit,
wherein largest outer diameter of the holding member in a direction that is parallel to a surface of the conductive contact holder is larger than an interval between the two hollow portions.

11. The conductive contact unit according to claim 10, wherein the circuit substrate includes a coplanar microstrip line for differential transmission.

* * * * *